United States Patent
Nakamura et al.

[11] Patent Number: 5,816,480
[45] Date of Patent: Oct. 6, 1998

[54] METHOD FOR CLEANING A BONDING TOOL USED ON COVERED BONDING WIRES

[75] Inventors: Osamu Nakamura, Kokubunji; Kazumasa Sasakura, Musashimurayama, both of Japan

[73] Assignee: Kabushiki Kaisha Shinkawa, Tokyo, Japan

[21] Appl. No.: 754,977

[22] Filed: Nov. 22, 1996

[30] Foreign Application Priority Data

Nov. 24, 1995 [JP] Japan .................................. 7-329522

[51] Int. Cl.[6] .......................... B23K 31/02; B23K 37/00
[52] U.S. Cl. ...................... 228/201; 228/205; 228/180.5; 219/56.22
[58] Field of Search ................. 228/4.5, 180.5, 228/201, 205; 219/56.21, 56.22

[56] References Cited

U.S. PATENT DOCUMENTS

| | | | |
|---|---|---|---|
| 5,176,310 | 1/1993 | Akiyama et al. | 228/4.5 |
| 5,285,949 | 2/1994 | Okikawa et al. | 228/205 |
| 5,370,300 | 12/1994 | Okumura | 228/180.5 |
| 5,545,868 | 8/1996 | Ohmi et al. | 228/201 |

FOREIGN PATENT DOCUMENTS

| | | | |
|---|---|---|---|
| 62-140428 | 6/1987 | Japan | 228/205 |
| 63-249344 | 10/1988 | Japan | 228/205 |
| 2-146742 | 6/1990 | Japan | 219/56.21 |
| 4-222410 | 8/1992 | Japan . | |
| 5-190589 | 7/1993 | Japan . | |

*Primary Examiner*—Patrick Ryan
*Assistant Examiner*—Jeffrey T. Knapp
*Attorney, Agent, or Firm*—Koda & Androlia

[57] ABSTRACT

A method for cleaning a bonding tool of a bonding apparatus includes a step of positioning a tip portion of the bonding tool between a pair of discharge electrodes, which are primarily used for removing a covering that covers a bonding wire, and a step of causing an electrical discharge across the discharge electrodes by applying a high voltage, such as of 3500 V, by connecting the discharge electrodes to positive and negative poles of a discharge power source, respectively. The electrical discharge is performed with the bonding wire kept inside the bonding tool so as not to project out of the bonding tool or after the bonding wire is removed from the bonding tool.

3 Claims, 4 Drawing Sheets

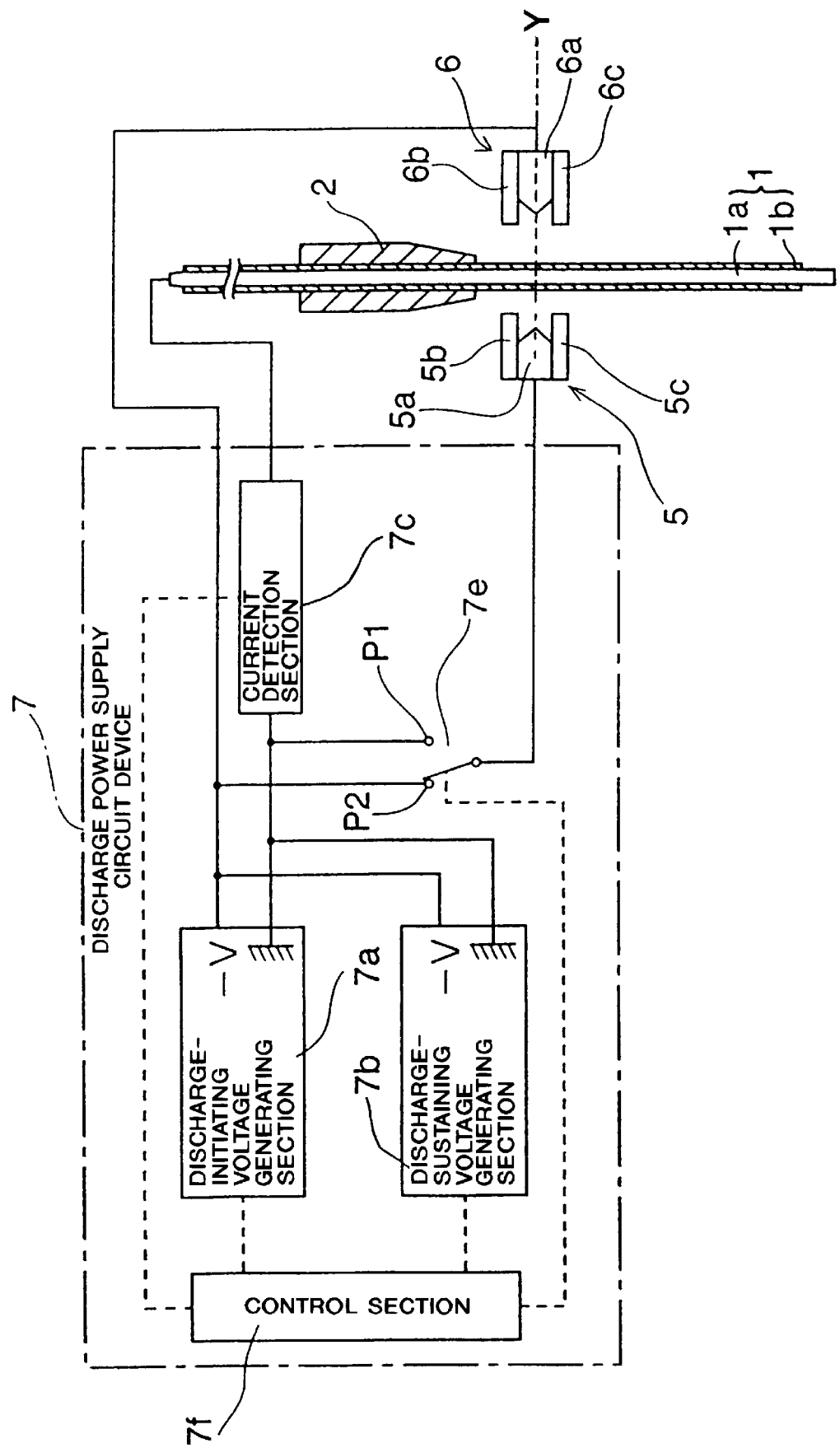

5,816,480

METHOD FOR CLEANING A BONDING TOOL USED ON COVERED BONDING WIRES

BACKGROUND OF THE INVENTION

1. Field of the Invention

The present invention relates to a method for cleaning a wire bonding tool which is used on covered bonding wires.

2. Prior Art

Some wire bonding methods employed in the manufacturing of semiconductor devices use covered bonding wires, and such methods include a step to remove the coverings from the bonding wires. In this step, the covering is removed from a portion of the covered wire that is intended to be bonded to a second bonding position of a workpiece.

One example of this conventional method for removing the covering from a covered wire is disclosed in Japanese Patent Application Laid-Open (Kokai) No. 4-222410. The method of this prior art will be described below with reference to the accompanying FIGS. 3 and 4.

In particular, a covered wire 1 is constructed from a core wire 1a, which is a conductor, and a covering 1b which covers the core wire 1a. The covering 1b is made of a polymer resin that has electrical insulating properties. When this covered wire 1 is used for bonding, the covered wire 1 is passed through a bonding tool 2, and the portion of the covering 1b which covers an intended second bonding position of the wire 1 that extends out of the tip part of this bonding tool 2 is removed by an electrical discharge effected by a pair of discharge electrodes. These discharge electrodes are referred to by the reference numerals 3 and 4 in FIG. 3 and by the reference numerals 5 and 6 in FIG. 4, respectively.

The pair of discharge electrodes 3 and 4 in FIG. 3 face each other on a plane X that is perpendicular to the covered wire 1; and on this perpendicular plane X, a discharge-initiating point 3s of the discharge electrode 3 and a discharge-initiating point 4s of the discharge electrode 4 face each other with a minimum distance in between. An electrically insulating body 4a is installed on the upper surface of one of the discharge electrodes, i. e. on the discharge electrode 4 so that the insulating body 4a projects a predetermined distance toward the covered wire 1.

The pair of discharge electrodes 5 and 6 shown in FIG. 4 face each other on a plane Y that is perpendicular to the covered wire 1; and electrically insulating bodies 5b and 5c are installed on the upper and lower surfaces of an electrode main body 5a of the electrode 5, and electrically insulating bodies 6b and 6c are installed on the upper and lower surfaces of an electrode main body 6a of the electrode 6.

A discharge power supply circuit device 7 that activates the electrodes 3 and 4 and the electrodes 5 and 6, respectively, in FIGS. 3 and 4, includes a high-voltage generating section that includes a discharge-initiating voltage generating section 7a and a discharge-sustaining voltage generating section 7b. The discharge power supply circuit device 7 further includes a current detection section 7c, a switch 7d (FIG. 3) or a switch 7e (FIG. 4), as well as a control section 7f which controls the components of the circuit device 7, which are electrically connected.

As seen from both FIGS. 3 and 4, the rear end of the core wire 1a is connected to the respective positive poles of the discharge-initiating voltage generating section 7a and the discharge-sustaining voltage generating section 7b via the current detection section 7c. One of the discharge electrodes shown in FIG. 3, i.e., the discharge electrode 3, is connected to the respective positive poles of the discharge-initiating voltage generating section 7a and the discharge-sustaining voltage generating section 7b with the switch 7d in between. The other discharge electrode 4 is connected to the respective negative poles of the discharge-initiating voltage generating section 7a and the discharge-sustaining voltage generating section 7b. The core wire 1a of the covered wire 1 and the discharge electrode 3 are set so as to have the same potential when the switch 7d is closed, that is, when the switch 7d is switched "on".

The switch 7e shown in FIG. 4 functions differently from the switch 7d of FIG. 3. In particular, the switch 7e includes contacts P1 and P2, and these contacts are respectively connected to the positive poles and negative poles of the discharge-initiating voltage generating section 7a and discharge-sustaining voltage generating section 7b. The connection of the discharge electrode 5 can be switched as desired between the same positive pole side as the core wire 1a of the covered wire 1 (contact P1) and between the same negative pole side as the other discharge electrode 6 (contact P2).

When the covering 1b is removed from the covered wire 1 in the system shown in FIG. 3, the control section 7f first closes the switch 7d; as a result, the discharge electrode 3 and the core wire 1a are both electrically connected to the positive poles of the discharge-initiating voltage generating section 7a, and the control section 7f actuates the discharge-initiating voltage generating section 7a. A resulting high voltage (for instance 3500 V) is applied across the discharge electrodes 3 and 4 from the discharge-initiating voltage generating section 7a. The discharge is initiated between the discharge-initiating points 3s and 4s, and then the voltage across both ends of the discharge-initiating points 3s and 4s spontaneously drops to approximately 500 V.

When this voltage drop occurs, this drop is detected; and based upon the detection signal that indicates the detection of the voltage drop across the discharge-initiating points 3s and 4s of the discharge electrodes 3 and 4, the control section 7f switches from the discharge-initiating voltage generating section 7a to the discharge-sustaining voltage generating section 7b and activate the discharge-sustaining voltage generating section 7b. As a result, a high voltage is applied across the discharge electrodes 3 and 4 for a predetermined period of time by the discharge-sustaining voltage generating section 7b.

In order to re-initiate the discharge, the control section 7f actuates the discharge-initiating voltage generating section 7a and the discharge-sustaining voltage generating section 7b. This series of discharges are repeatedly generated. As a result, a portion of the covering 1b of the covered wire 1 is stripped off, so that an exposed portion of the core wire 1a is revealed. The exposed portion extends up to the position of the electrically insulating body 4a installed on the upper end of the discharge electrode 4 by subsequent discharges.

A method used to remove the covering 1b from the covered wire 1 in the system shown in FIG. 4 will be described below.

Discharge control is performed as in the case of FIG. 3. At the time the initial discharge is started, the switch 7e is connected to the contact PI so that the discharge electrode 5 is electrically connected to the same positive poles as the core wire 1a and has the same potential. As a result, a discharge is performed between the discharge electrodes 5 and 6. When an exposed portion is formed in the covering 1b of the wire 1 by this discharge, a discharge also begins to take place between the core wire 1a and the discharge electrode 6 as a result of insulation breakdown. Then, when the insulation breakage is detected by the current detection section 7c, the control section 7f switches the switch 7e from the contact P1 to the contact P2 so as to electrically connect the discharge electrode 5 so that the electrode 5 has the same negative pole potential as the discharge electrode 6. In this way, the length of the exposed portion of the core wire 1a is controlled by the discharge between the core wire 1a and the discharge electrodes 5 and 6.

As seen from above, in either system shown in FIG. 3 and FIG. 4, the covering 1b of the covered wire 1 is removed by being thermally decomposed by the thermal energy generated by the electrical discharge effected by the discharge electrodes 3 and 4 in FIG. 3 and the discharge electrodes 5 and 6 in FIG. 4.

When the covering 1b is removed, the thermally decomposed covering 1b scatters and contaminates the bonding tool 2. When the bonding tool 2 is thus contaminated, clogging of the bonding tool and other troubles result, thus causing a drop in the reliability and productivity of the wire bonding operation.

Japanese Patent Application Laid-Open (Kokai) No. 5-190589 discloses a conventional method for cleaning wire bonding tools used on covered wires. In this method, substances adhering to the tip of the bonding tool are removed by projecting a flame or blowing a high-temperature air draft onto the tip portion of the bonding tool.

However, this bonding tool cleaning method requires a flame generating device or a high temperature generating device. When a flame is used, there are problems in terms of safety, since flammable materials such as combustible gases, etc. are also used in this method.

SUMMARY OF THE INVENTION

The object of the present invention is to provide a method for cleaning a wire bonding tool used on covered wires which requires no use of any novel device for cleaning the bonding tool and which is superior in terms of safety.

More specifically, in the method of the present invention, a pair of discharge electrodes which are used for removing the covering from a covered wire is further used for cleaning the bonding tool; and with the covered wire kept inside of the bonding tool, the tip part of the bonding tool is brought between the pair of discharge electrodes; then, with one of the discharge electrodes electrically connected to positive poles, and the other discharge electrode electrically connected to the negative pole, the electrodes are causes to discharge and thereby remove the adhered materials from the tip end of the bonding tool.

In the present invention, the bonding tool is cleaned using the pair of discharge electrodes (which are primarily used to remove the covering of the covered wire) and a discharge power supply circuit device which applies a high voltage to the discharge electrodes. In other words, when the bonding tool is cleaned, the covered wire is removed from the bonding tool or is kept so as not to project out of the tip part of the bonding tool; and the tip part of the bonding tool is brought between the pair of electrodes, or in other words the discharge electrodes are brought closer to each other from both sides without contacting the bonding tool. Then, a discharge is caused to take place on one discharge electrode connected to positive poles and on the other discharge electrode connected to negative poles. As a result of this discharge, resinous contaminants adhering to the tip area of the bonding tool are thermally decomposed and removed by sublimation, thus cleaning the tip part of the bonding tool.

The bonding tool can be thus cleaned using an existing device; accordingly, there is no increase in equipment costs. In addition, since no combustible gases, etc., are used, the method of the present invention is superior in terms of safety.

BRIEF DESCRIPTION OF THE DRAWINGS

FIG. 4 is a block diagram of another conventional wire bonding apparatus that uses covered wires.

DETAILED DESCRIPTION OF THE PREFERRED EMBODIMENTS

Figure 1:
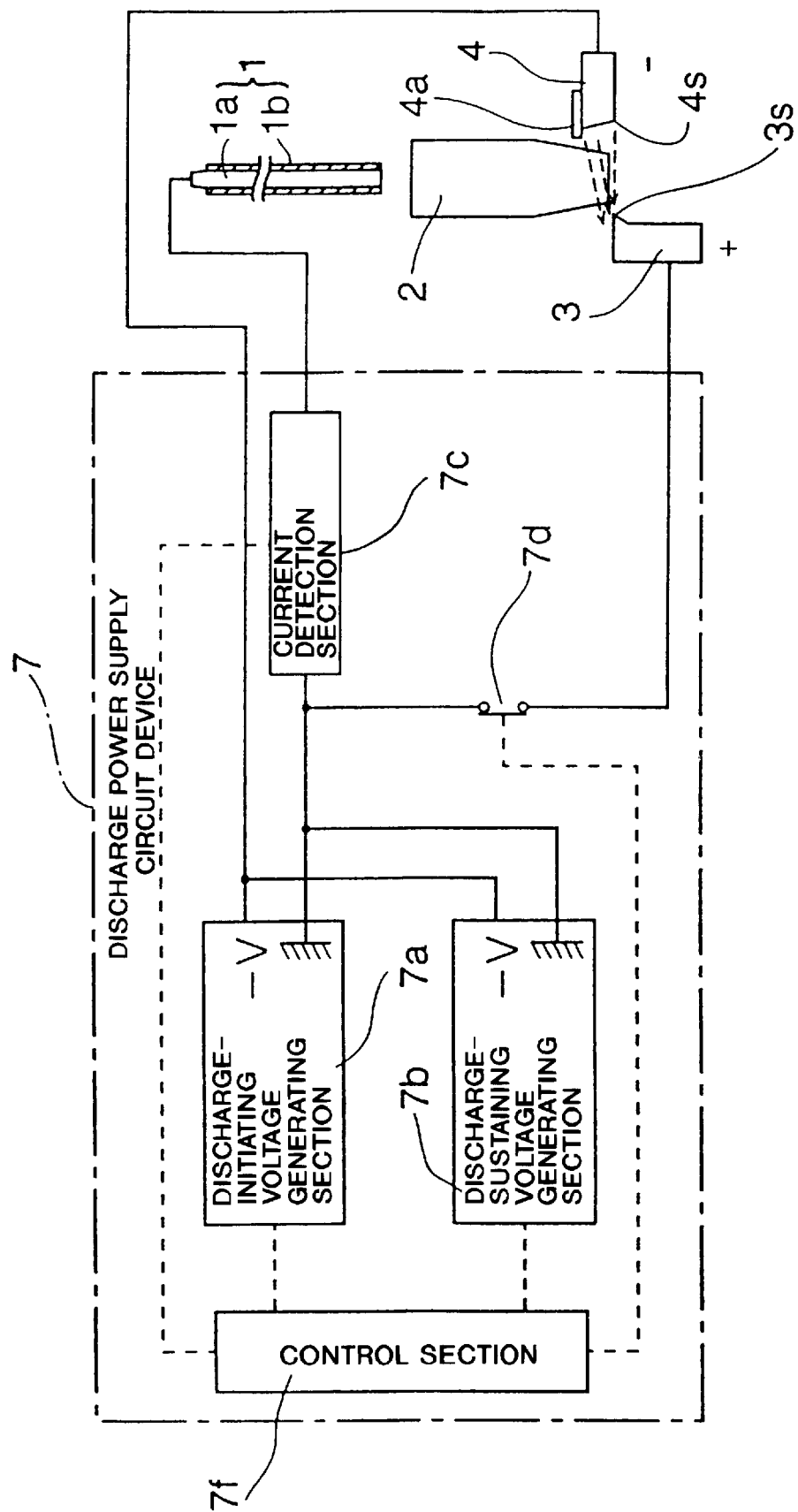
FIG. 1 is a block diagram which illustrates one embodiment of the method of the present invention for cleaning a bonding tool used on covered wires.
Figure 2:
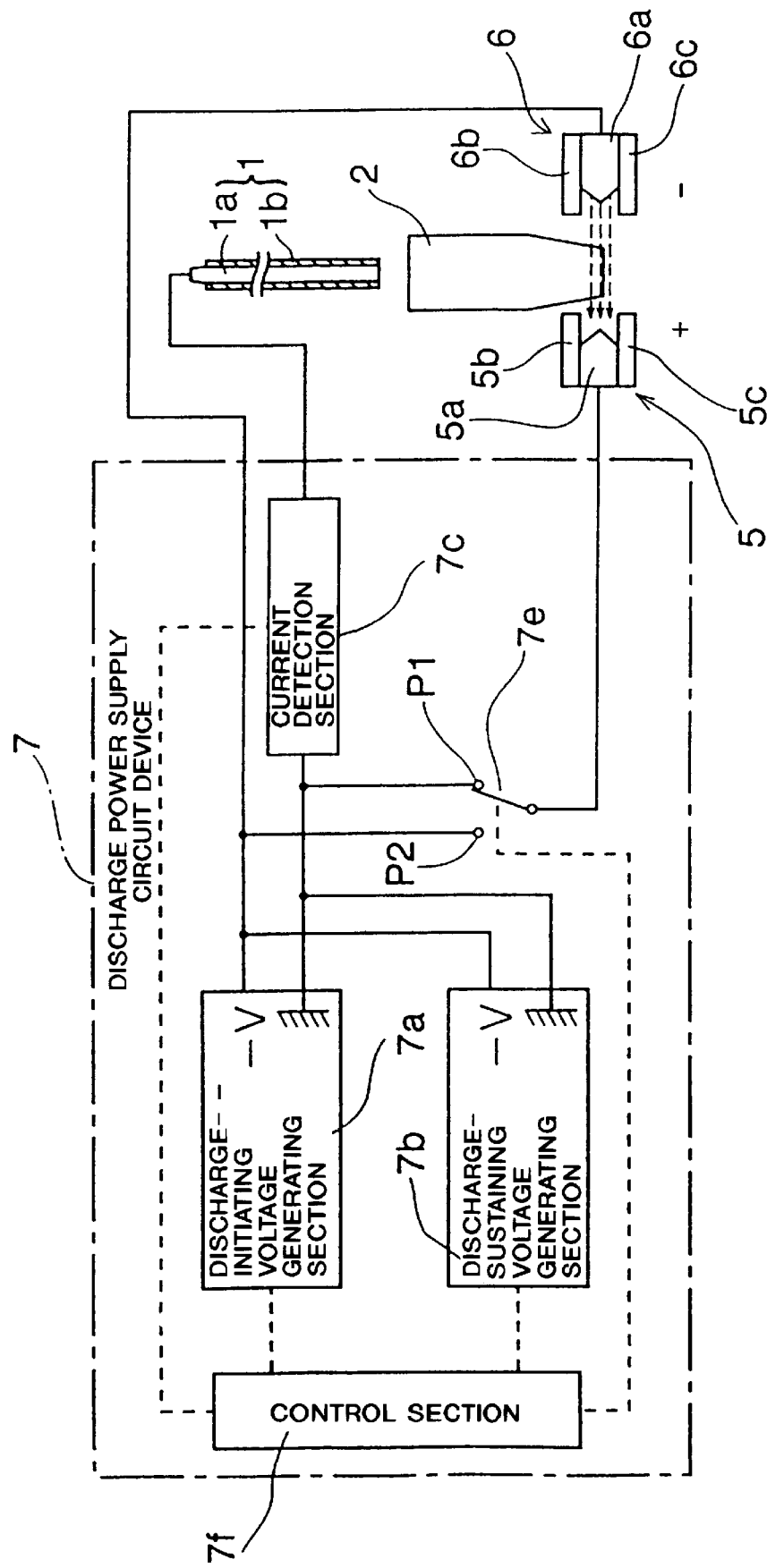
FIG. 2 is a block diagram which illustrates another embodiment of the method of the present invention for cleaning a bonding tool used on covered wires.
Figure 3:
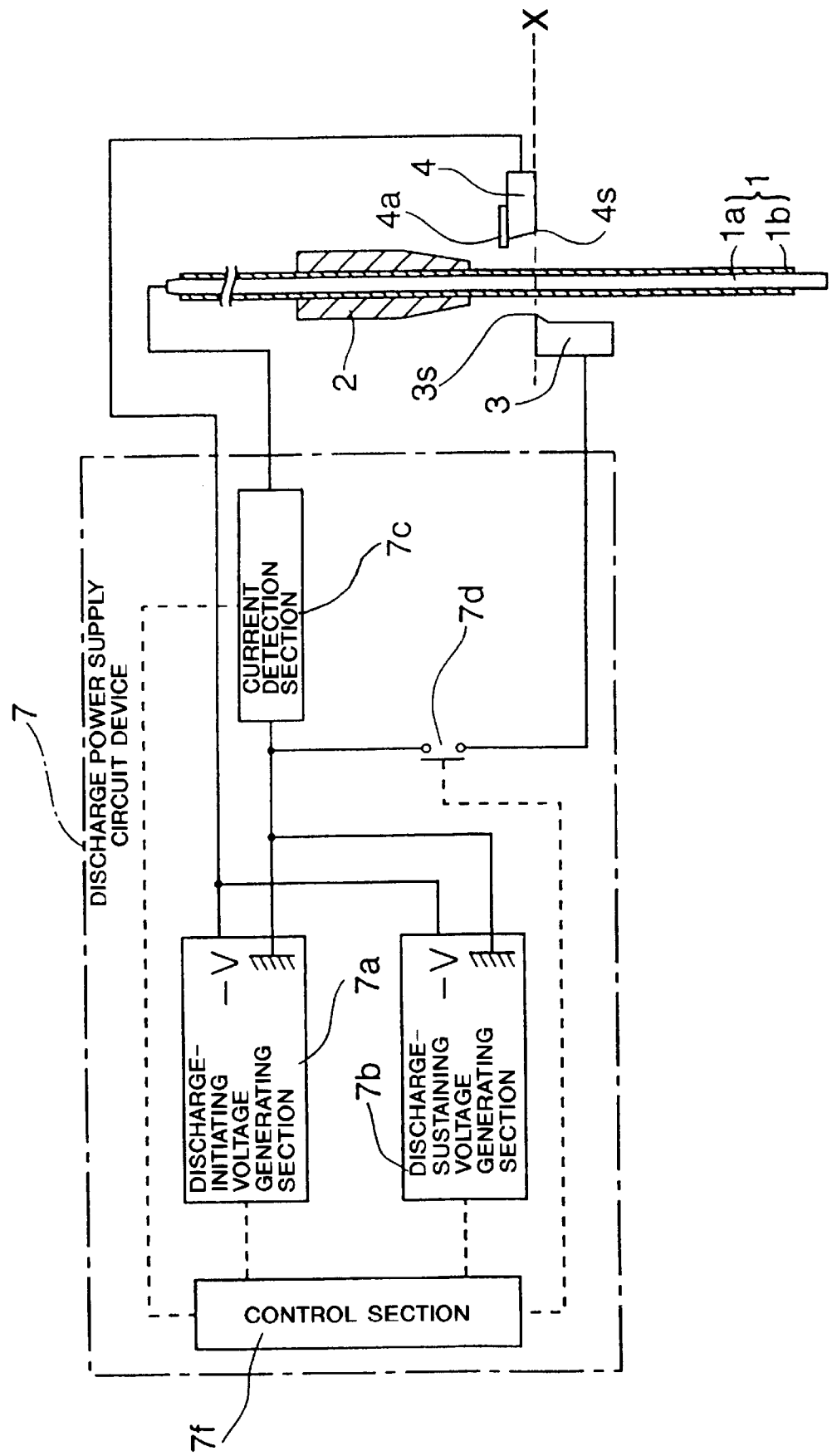
FIG. 3 is a block diagram of a conventional wire bonding apparatus that uses covered-wires.

One embodiment of the present invention will be described with reference to FIGS. 1 and 2. In FIG. 1, the bonding tool is cleaned in a wire bonding device of the type shown in FIG. 3; while in FIG. 2, the bonding tool is cleaned in a wire bonding device of the type shown in FIG. 4. Accordingly, components which are the same as in FIGS. 2 and 4 are labeled with the same symbols, and a detailed description of such elements is omitted.

In the method of the present invention, before cleaning is performed, the covered wire 1 is removed (or pulled out) from the bonding tool 2; or the covered wire 1 is retracted so that the covered wire 1 does not protrude from the tip part of the bonding tool 2. In this state, as shown in FIGS. 1 and 2, the tip part of the bonding tool 2 is positioned between the pair of discharge electrodes 3 and 4 (in FIG. 1) or the pair of discharge electrodes 5 and 6 (in FIG. 2). Instead, the discharge electrodes 3 and 4 or discharge electrodes 5 and 6 are brought close to but not in contact with the bonding tool 2.

When a tool cleaning button (not shown) is pressed, the switch 7d, in the case of FIG. 1, is closed by a signal from the control section 7f, so that one discharge electrode 3 becomes positive. The control section 7f next actuates the discharge-initiating voltage generating section 7a; since the other discharge electrode 4 is connected to the negative pole, a high voltage, for example, 3500 V, is applied across the discharge electrodes 3 and 4 by the discharge-initiating voltage generating section 7a; and as a result, a discharge is initiated between the discharge-initiating points 3s and 4s, and then the voltage across both ends of the discharge-initiating points 3s and 4s drops spontaneously to approximately 500 V.

Based upon a detection signal indicative of this voltage drop across the discharge-initiating points 3s and 4s of the discharge electrodes 3 and 4, the control section 7f switches from the discharge-initiating voltage generating section 7a to the discharge-sustaining voltage generating section 7b so that the discharge-sustaining voltage generating section 7b is activated. As a result, a high voltage is applied across the discharge electrodes 3 and 4, as indicated by the dotted arrows in FIG. 1, for a predetermined period of time by the discharge-sustaining voltage generating section 7b. Furthermore, in order to re-initiate the discharge, the control section 7f successively actuates the discharge-initiating voltage generating section 7a and then the discharge-sustaining voltage generating section 7b; and this series of discharges is repeated. As a result, resinous contaminants adhering to the tip part of the bonding tool 2 are thermally decomposed and removed by sublimation, and thus the tip part of the bonding tool 2 is cleaned.

In the case of the system shown in FIG. 2, when a tool cleaning button (not shown) is pressed, the switch 7e is connected to the contact P1 by a signal from the control section 7f; as a result, the discharge electrode 5 becomes positive, while the other discharge electrode 6 becomes negative. Next, as in the case of FIG. 1, the control section 7f actuates the discharge-initiating voltage generating section 7a. When the discharge-initiating voltage generating section 7a is thus actuated, a high voltage is applied across the discharge electrodes 5 and 6, as indicated by the dotted arrows, since the other discharge electrode 6 is connected to the negative poles. Thus, a discharge is initiated between the discharge electrodes 5 and 6, and then the voltage of the discharge drops spontaneously.

Based upon a detection signal indicating this voltage drop across the discharge electrodes 5 and 6, the control section 7f switches from the discharge-initiating voltage generating section 7a to the discharge-sustaining voltage generating section 7b so that the discharge-sustaining voltage generating section 7b is actuated. As a result, a high voltage is applied across the discharge electrodes 5 and 6 for a predetermined period of time by the discharge-sustaining voltage generating section 7b. Furthermore, in order to re-initiate the discharge, the control section 7f successively actuates the discharge-initiating voltage generating section 7a and then the discharge-sustaining voltage generating section 7b; and this series of discharges is repeated. As a result, resinous contaminants adhering to the tip part of the bonding tool 2 are thermally decomposed and removed by sublimation, and the tip part of the bonding tool 2 is cleaned.

As described above in detail, according to the present invention, substances adhering to the tip part of a bonding tool are removed using a pair of discharge electrodes which are practically used to remove the covering from a covered wire. In other words, the tip part of the bonding tool is positioned between the pair of discharge electrodes so that the covered wire does not project beyond the tip part of the bonding tool; one of the discharge electrodes is electrically connected to positive poles, and the other discharge electrode is electrically connected to negative poles; and then the electrodes are caused to discharge. This discharge removes resinous contaminants adhering to the tip part of the bonding tool; in other words, they are thermally decomposed and removed by sublimation. Thus, the method of the present invention does not require the use of any novel device, and it is superior in terms of safety.

What is claimed is:

1. A method for cleaning a wire bonding tool used on covered wires characterized in that a substance adhering to a tip part of said bonding tool is removed using a pair of facing discharge electrodes which are used to remove a covering from a covered wire, the method comprising by: positioning said tip part of said bonding tool between said pair of discharge electrodes so that said covered wire does not project beyond said tip part of said bonding tool, connecting one of said discharge electrodes to a positive pole, connecting another of said discharge electrode to a negative pole, and then causing said electrodes to discharge.

2. A method for cleaning a bonding tool by a pair of discharge electrodes which are practically used for removing a covering that covers a bonding wire, said method comprising the steps of:

positioning said bonding tool between said pair of discharge electrodes with an end of said bonding wire kept inside said bonding tool so as not to project out of said bonding tool; and causing said pair of discharge electrodes to discharge by connecting one of said pair of discharge electrodes to a positive pole of an electrical discharge power source and connecting another of said pair of discharge electrodes to a negative pole of said electrical discharge power source, thus thermally decomposing a substance adhering on a surface of said bonding tool.

3. A method according to claim 2, wherein said electrical discharge is performed by repeatedly applying a high voltage across said pair of discharge electrodes with said bonding tool in between.

* * * * *